(12) United States Patent
Boyle et al.

(10) Patent No.: US 7,989,320 B2
(45) Date of Patent: Aug. 2, 2011

(54) DIE BONDING

(75) Inventors: Adrian Boyle, Rathangan (IE); David Gillen, Clontarf (IE); Maria Farsari, Heraklion (GR)

(73) Assignee: Electro Scientific Industries, Inc., Portland, OR (US)

( * ) Notice: Subject to any disclaimer, the term of this patent is extended or adjusted under 35 U.S.C. 154(b) by 720 days.

(21) Appl. No.: 10/561,883

(22) PCT Filed: Jul. 1, 2004

(86) PCT No.: PCT/EP2004/007161
§ 371 (c)(1),
(2), (4) Date: May 8, 2007

(87) PCT Pub. No.: WO2005/004226
PCT Pub. Date: Jan. 13, 2005

(65) Prior Publication Data
US 2007/0224733 A1    Sep. 27, 2007

(30) Foreign Application Priority Data
Jul. 3, 2003   (GB) .................................. 0315623.9

(51) Int. Cl.
*H01L 21/00*   (2006.01)

(52) U.S. Cl. ........ 438/463; 438/113; 438/118; 257/782; 257/E21.598; 257/E21.599

(58) Field of Classification Search ........................ None
See application file for complete search history.

(56) References Cited

U.S. PATENT DOCUMENTS

| 3,637,377 | A | | 1/1972 | Hallman et al. |
| 3,679,502 | A | | 7/1972 | Hays |
| 3,811,182 | A | | 5/1974 | Ryan et al. |
| 3,866,398 | A | | 2/1975 | Holloway et al. |
| 4,331,504 | A | | 5/1982 | Chuang et al. |
| 4,566,935 | A | | 1/1986 | Hornbeck |
| 4,617,086 | A | | 10/1986 | Chuang et al. |
| 4,639,572 | A | | 1/1987 | Gruzman et al. |
| 4,731,158 | A | | 3/1988 | Brannon |
| 5,110,388 | A | * | 5/1992 | Komiyama et al. ........... 156/229 |

(Continued)

FOREIGN PATENT DOCUMENTS

EP    0 359 373    3/1990

(Continued)

OTHER PUBLICATIONS

Notification of Reasons for Refusal, JP 2006-516088, Mar. 8, 2010.

(Continued)

*Primary Examiner* — Julio J Maldonado
*Assistant Examiner* — Shaka Scarlett

(57) ABSTRACT

A die bonding method and apparatus by which a wafer substrate 11 adhered to a carrier tape 13 by an adhesive layer 12 is laser machined through the wafer substrate and through the adhesive layer at most to scribe the carrier tape to form a singulated die 15 with an attached singulated adhesive layer, without substantial delamination of the adhesive layer 12 and carrier tape 13 or substantial production of burrs from the adhesive layer 12. The carrier tape 13 is cured, preferably by ultraviolet light, to release the adhesive layer from the carrier tape. The singulated die is picked and placed on a die pad and the adhesive layer 12 is cured, preferably by heat, to adhere the die to the die pad.

21 Claims, 2 Drawing Sheets

U.S. PATENT DOCUMENTS

| | | | |
|---|---|---|---|
| 5,266,532 A | 11/1993 | Russell et al. | |
| 5,322,988 A | 6/1994 | Russell et al. | |
| 5,358,590 A | 10/1994 | Yamanaka | |
| 5,597,767 A * | 1/1997 | Mignardi et al. | 438/14 |
| 5,641,714 A * | 6/1997 | Yamanaka | 438/14 |
| 5,762,744 A * | 6/1998 | Shibata et al. | 156/235 |
| 5,916,460 A | 6/1999 | Imoto et al. | |
| 6,130,401 A | 10/2000 | Yoo et al. | |
| 6,319,754 B1 | 11/2001 | Lin et al. | |
| 6,350,391 B1 | 2/2002 | Livshits et al. | |
| 6,472,295 B1 * | 10/2002 | Morris et al. | 438/463 |
| 6,586,707 B2 | 7/2003 | Boyle et al. | |
| 6,676,878 B2 | 1/2004 | O'Brien et al. | |
| 6,792,326 B1 | 9/2004 | Duignan | |
| 6,902,990 B2 | 6/2005 | Gottfried et al. | |
| 7,776,720 B2 | 8/2010 | Boyle et al. | |
| 2002/0019074 A1 | 2/2002 | Nakazawa et al. | |
| 2002/0088780 A1 | 7/2002 | Farsari et al. | |
| 2002/0115235 A1 | 8/2002 | Sawada | |
| 2002/0158259 A1 | 10/2002 | Ono et al. | |
| 2003/0129809 A1 | 7/2003 | Takyu et al. | |
| 2004/0048419 A1 | 3/2004 | Kitamura et al. | |
| 2004/0180473 A1 | 9/2004 | Kawai | |
| 2005/0009307 A1 * | 1/2005 | Shigematsu et al. | 438/487 |
| 2006/0249480 A1 | 11/2006 | Boyle | |

FOREIGN PATENT DOCUMENTS

| | | |
|---|---|---|
| EP | 1 107 299 | 6/2001 |
| EP | 1 244 143 | 9/2002 |
| JP | 08-174244 | 7/1996 |
| JP | 11-040523 | 2/1999 |
| JP | 2002343747 A * | 11/2002 |
| JP | 2003-173988 | 6/2003 |
| WO | WO97/24768 | 7/1997 |
| WO | WO00/72224 | 11/2000 |
| WO | WO02/34455 | 5/2002 |
| WO | WO 03/049164 | 6/2003 |

OTHER PUBLICATIONS

Fowlkes et al., "Microstructural Evolution of Laser-Exposed Silicon Targets in $SF_6$ Atmospheres," *Applied Physics Letters*, vol. 77, No. 11, pp. 1629-1631, Sep. 11, 2000.

* cited by examiner

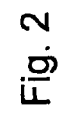
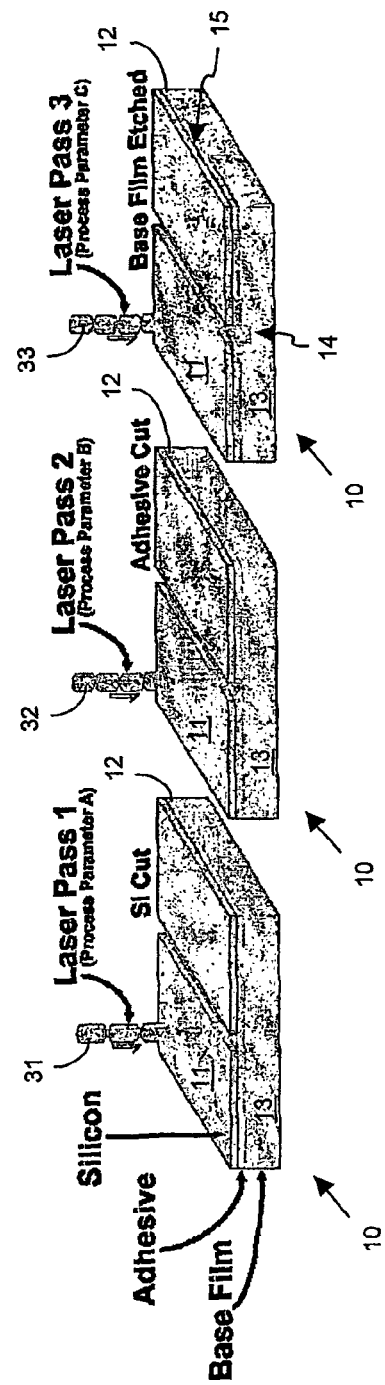

DIE BONDING

CROSS-REFERENCE TO RELATED APPLICATIONS

This application is derived from PCT patent application PCT/EP2004/007161 filed Jul. 1, 2004 and claims priority from GB 0315623.9 filed Jul. 3, 2003.

FIELD OF THE INVENTION

This invention relates to die bonding.

BACKGROUND OF THE INVENTION

The use of dies with die attach films (DAF) transported on a base material carrier tape to provide direct bonding of dies to a die pad is well known in the microelectronics industry. On picking up a singulated die from the carrier tape, an adhesive layer is carried on a lower surface of the die and, after placing the die on a die pad, the adhesive layer is cured by heating to adhere the die to the die pad. A cross-section of such a structure 10 of a wafer 11 mounted on a DAF adhesive layer 12 and carrier base 13 before dicing is shown on FIG. 1. The wafer 11 and the DAF 12 are singulated to form a singulated die and DAF 15, as shown in FIG. 2, as in dicing a wafer without a DAF, by cutting a channel 14 through the wafer and DAF and leaving a shallow trench 16 in the base film carrier tape 13.

Known dicing of a wafer with a DAF uses a mechanical saw but using higher speed revolution of a dicing saw blade than used to dice a wafer without a DAF, to avoid the adhesive layer adhering to the saw blade. However, such high-speed mechanical cutting tends to cause delamination of the DAF and base film and to create burrs, resulting in yield loss. Burrs created by the mechanical saw can be millimeter long strands of the adhesive layer. These strands may come into contact with an upper surface of the die, either by being carried to the upper surface by the saw blade or in subsequent handling and, in particular, may interfere with a die attach process. In some cases, adhesive is placed on individual die after mechanical saw dicing in order to avoid the problems associated with delamination when using a DAF and creation of burrs. This process is extremely time consuming and inefficient.

It is an object of the present invention at least to ameliorate the aforesaid difficulties in the prior art.

SUMMARY OF THE INVENTION

According to a first aspect of the present invention there is provided a method of die bonding comprising the steps of: providing a structure comprising a wafer substrate separated from carrier base means by an adhesive layer; laser machining through the wafer substrate and through the adhesive layer no more than at most to scribe the carrier base means to form a singulated die with an attached singulated adhesive layer; curing the structure to release the attached singulated adhesive layer from the carrier base means; picking and placing the die and attached singulated adhesive layer on a die pad; and curing the attached singulated adhesive layer to adhere the die to the die pad.

Advantageously, the step of providing a structure comprises providing an adhesive layer adhered to the carrier base means by a first adhesive and the step of curing the structure comprises curing the first adhesive.

Preferably, the step of laser machining comprises laser machining the wafer substrate using a first laser beam with a first machining profile of selected laser pulse power, laser pulse repetition rate, laser pulse width, laser beam scanning speed and laser wavelength; using a second laser beam with a second such machining profile to machine the adhesive layer and using a third laser beam with a third such machining profile to machine the carrier base means such that a speed of machining is maximised while providing a predetermined quality of singulated dies without substantial delamination of the adhesive layer and the carrier base means or substantial production of burrs.

Conveniently, at least two of the first machining profile, the second machining profile and the third machining profile are a same machining profile.

Advantageously, the step of curing the structure comprises curing with ultraviolet light.

Conveniently, the step of curing the attached singulated adhesive layer comprises heat curing the adhesive layer.

Advantageously, the step of machining the wafer substrate comprises machining a blind via in the wafer substrate or a via through the wafer substrate and a die attach film.

Preferably, the step of laser machining includes a further step, after laser machining, of washing the structure to remove accumulated laser machining debris from the singulated die.

Conveniently, the step of providing a structure comprises providing a structure having a protective film to protect the structure from debris produced during laser machining and the step of washing the structure comprises removing the protective film and accumulated debris thereon.

Advantageously, the step of providing a structure comprises providing a structure having a wafer substrate less than 800 microns thick.

Preferably, the step of laser machining comprises providing an assist gas environment for laser machining.

Advantageously, the step of providing an assist gas environment comprises providing a gas environment in which photo-dissociation produces active radicals.

Preferably, the step of providing a gas environment reduces deposition of solid machining debris around a laser-machining site.

Conveniently, the carrier base means is one of: a dicing tape, an inflexible tape suitable for thin wafer dicing or backgrinding; and a glass or other transparent solid.

Advantageously, the step of providing a structure comprises providing a structure including a wafer substrate separated facedown from substantially inflexible transparent backgrinding tape means by the adhesive layer and the step of laser machining is performed subsequent to backgrinding the wafer substrate.

Alternatively, the step of picking and placing the die and attached singulated adhesive layer comprises picking and placing the die and attached singulated adhesive layer on another die to form a multistack die package.

According to a second aspect of the present invention, there is provided die bonding apparatus comprising: laser machining means for machining a wafer substrate and an adhesive layer attached to the wafer substrate and for no more than at most scribing underlying carrier base means to form a singulated die with a singulated adhesive layer; first curing means for curing the carrier base means to release the singulated adhesive layer from the carrier base means; pick and place means for picking the singulated die and adhesive layer from the carrier base means and placing the singulated die and adhesive layer on die pad means and second curing means for curing the singulated adhesive layer of the singulated die to adhere the singulated die to the die pad means.

Preferably, the laser machining means comprises: laser source means for providing a pulsed laser beam; laser beam scanning means; and control means for controlling at least one of laser pulse energy, laser wavelength, laser repetition frequency, laser pulse width, laser beam scanning speed and a number of scans by the pulsed laser beam.

Advantageously, the laser machining means further comprises memory means for storing a machining profile of at least one of laser pulse energy, laser wavelength, laser repetition frequency, laser pulse width, laser beam scanning speed and a number of scans by the pulsed laser beam, for use by the control means.

Preferably, the first curing means comprises ultraviolet curing means.

Advantageously, the second curing means comprises heat curing means.

Conveniently, the die bonding apparatus includes washing means for washing laser machining debris from the singulated die.

Advantageously, the wafer substrate is provided with a protective film to protect the wafer substrate from laser machining debris, and the washing means is arranged to remove the protective film from the singulated die.

Conveniently, the die bonding apparatus is adapted for carrier base means which is one of: a dicing tape, an inflexible tape suitable for thin wafer dicing or backgrinding; and a glass or other transparent solid.

Advantageously, the die bonding apparatus is adapted for machining a structure comprising a wafer substrate separated facedown from substantially inflexible transparent backgrinding tape means by the adhesive layer.

BRIEF DESCRIPTION OF THE DRAWINGS

The invention will now be described, by way of example, with reference to the accompanying drawings in which:

FIG. 1 is a vertical cross-section of a known wafer, adhesive layer and carrier film structure;

FIG. 2 is the vertical cross-section of FIG. 1 after dicing;

FIG. 3 is a perspective schematic view of laser machining, according to the invention, of the wafer of the structure of FIG. 1;

FIG. 4 is a perspective schematic view of laser machining, according to the invention, of the adhesive layer of the structure of FIG. 1; and FIG. 5 is a perspective schematic view of laser scribing, according to the invention, of the carrier film of the structure of FIG. 1.

In the Figures like reference numerals denote like parts.

DETAILED DESCRIPTION OF EMBODIMENTS

Figure 6:
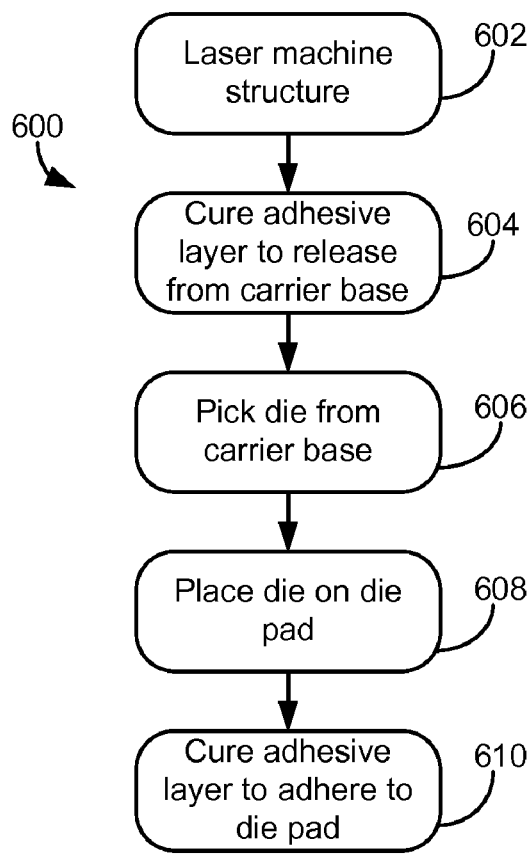
FIG. 6 is a flow diagram of a die bonding method according to one embodiment.

Referring to the Figures, using a laser beam 31, 32, 33 to dice a structure 10 comprising a wafer 11 with a DAF 12 mounted on a carrier base 13, it is possible to machine through the wafer and the DAF without causing substantially any delamination of the adhesive layer 12 and carrier base 13 or causing substantially any burrs, from, for example, the adhesive layer 12.

Figure 7:
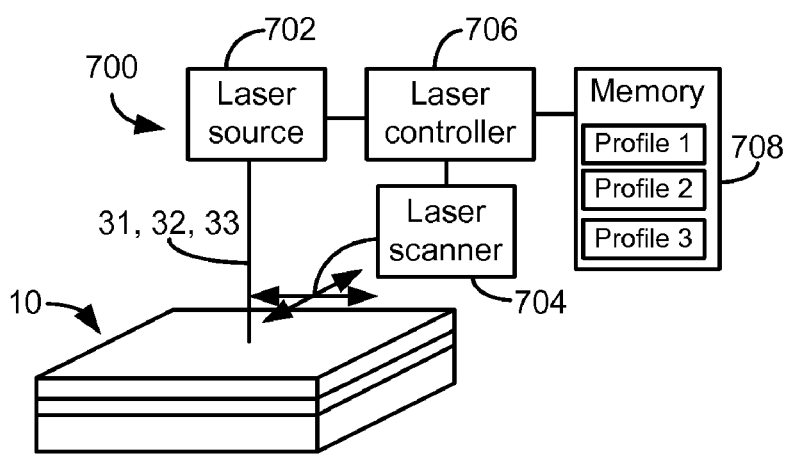
FIG. 7 is a block diagram of a laser machining system according to one embodiment for use in a die bonding apparatus.

The carrier base 13 may be, for example, any known carrier film as used in industry, a substantially inflexible support used in thin film dicing or backgrinding or a glass or other transparent solid. Alternatively, the carrier base may be an inflexible transparent backgrinding tape with the wafer mounted facedown on the backgrinding tape for dicing after a backgrinding process. To dice structure 10, a laser machining system 700 is provided as shown in block diagram form in FIG. 7. System 700 includes a laser source 702 for producing laser beam 31, 32, 33 and a laser scanner 704 to allow laser beam 31, 32, 33 to reach various parts of structure 10 to form dice lanes. System 700 also includes a laser controller 706 for controlling machining parameters of laser beam 31, 32, 33. Laser controller 706 operates according to cutting strategies or machining profiles stored in a memory 708 of apparatus 700.

Referring to FIGS. 3 to 5, by controlling critical machining parameters of pulse power, pulse repetition rate, pulse width, laser wavelength and laser beam scan speed of a laser beam 31, 32, 33, it is possible to dice the wafer 11 and the DAF 12 while only scribing the carrier base 13 and perform complete singulation without problems of delamination and burr. These critical parameters of the laser beam can be optimised for each layer 11, 12, 13 to use a laser beam 31, 32, 33 with a respective different cutting strategy or machining profile for each of the three layers, to maximise machining speed while obtaining a required quality of machined die.

In this case, each layer 11, 12, 13 is scanned with a predetermined number of one or more scans with predetermined machining parameters dependent on a known thickness and known machinability of material of the layer. Where the thickness and/or material are unknown, a nature of a material being machined and interfaces between layers may be determined by observation of machining characteristics. Alternatively, the parameters may be determined empirically from samples of wafers to be machined.

In order to optimise efficiency of singulation, all machining of the wafer may be performed before all machining of the adhesive layer, which may be performed before all machining of the carrier base or each dice lane may be completely machined in turn, or a combination of such strategies may be used.

Alternatively, where machining quality of the individual layers may be sacrificed for overall processing speed, a single cutting strategy or machining profile is used to cut two or all three layers 11, 12, 13, using an optimised machining profile for a combination of such layers.

A known translation table may be provided as part of laser scanner 704 to allow access of the laser beam to all parts of the wafer to be machined.

Although the laser machining process has been described as conveniently scribing the carrier base, it will be understood that alternatively laser machining may be halted at an interface of the adhesive layer and carrier base, without significantly, or at all, scribing the carrier base.

The laser machining process of the invention has been found to be suitable for wafers up to 800 µm thick.

This laser machining process is suitable not only for dicing wafers but also for machining via structures in wafers with a DAF.

The laser machining process of the invention may optionally be performed, in a known manner, in an active gas environment or in a gas environment where photo-dissociation produces active radicals. Laser machining in a suitable active gas environment changes a chemical nature of debris produced. In particular, under suitable conditions, a chemical reaction between a suitable active gas and the debris while in a molten state results in removal of debris in gaseous form, with consequentially reduced deposition of solid debris around a laser machining site.

Following singulation, the singulated die may be washed to remove debris produced during laser machining, before curing of the DAF. Alternatively, the wafer substrate may be protected from such debris by a protective film and the protective film and accumulated debris may be removed by washing.

FIG. 6 is a flow diagram of a die bonding method 600 according to one embodiment. Once the structure has been machined (step 602), die bonding of a singulated die proceeds substantially as in the prior art. The carrier base 13, or an adhesive, not shown, between the carrier base, tape or film and the adhesive layer, is cured with ultraviolet light to release the singulated die 15 from the carrier tape or film 13 (step 604). The singulated die 15 is picked from the carrier base, tape or film 13 (step 606) and placed on a die pad (step 608). Alternatively, the die 15 may be picked and placed on another die to form a multi-stack die package. The adhesive layer on the singulated die 15 is heat cured to adhere the singulated die to the die pad (step 610), or another die, for further known processing.

The invention claimed is:

1. A method of die bonding comprising the steps of:
providing a structure comprising a wafer substrate separated from a carrier base by a curable adhesive layer in a non-cured state positioned between the carrier base and the wafer substrate;
laser machining through the wafer substrate and the adhesive layer to form a singulated die with an attached singulated adhesive layer, the laser machining including controlling machining parameters of a laser beam in which a first laser machining profile is used to cut through the wafer substrate and a second laser machining profile is used to cut through the adhesive layer, the second laser machining profile being different from the first laser machining profile and adapted to inhibit delamination of the adhesive layer from the carrier base with the adhesive layer in the non-cured state;
performing a first curing process on the attached singulated adhesive layer to release the singulated die and the attached singulated adhesive layer from the carrier base and thereby enable the singulated die and the attached singulated adhesive layer to be removed from the carrier base and placed on a die pad; and
performing a second curing process to adhere the singulated die to the die pad.

2. The method as claimed in claim 1, wherein the machining parameters of the laser beam include laser pulse power, laser pulse repetition rate, laser pulse width, laser scanning speed and laser wavelength, and wherein the first laser machining profile corresponds to a first set of values of the machining parameters and the second laser machining profile corresponds to a second set of values of the machining parameters, a machining parameter value of the second set being different from a corresponding machining parameter value of the first set, the values of the first and second sets being selected such that a speed of machining is maximised while providing a predetermined quality of singulated dies without substantial production of burrs.

3. The method as claimed in claim 1, wherein the step of performing the first curing process comprises exposing the attached singulated adhesive layer to ultraviolet light.

4. The method as claimed in claim 1, wherein the step of performing the second curing process comprises heat curing the attached singulated adhesive layer.

5. The method as claimed in claim 1, wherein the step of laser machining through the wafer substrate comprises machining a blind via in the wafer substrate or a via through the wafer substrate and the adhesive layer.

6. The method as claimed in claim 1, further comprising washing the structure after the laser machining to remove accumulated laser machining debris from the singulated die.

7. The method as claimed in claim 6, wherein the step of providing a structure comprises providing a structure having a protective film to protect the structure from debris produced during the laser machining, and the step of washing the structure comprises removing the protective film and laser machining debris accumulated thereon.

8. The method as claimed in claim 1, wherein the step of providing a structure comprises providing a structure having a wafer substrate less than 800 microns thick.

9. The method as claimed in claim 1, wherein the step of laser machining comprises providing an assist gas environment for laser machining.

10. The method as claimed in claim 9, wherein the step of providing an assist gas environment comprises providing a gas environment in which photo-dissociation produces active radicals.

11. The method as claimed in claim 9, wherein the step of providing a gas environment reduces deposition of solid machining debris around a laser-machining site.

12. The method as claimed in claim 1, wherein the carrier base is one of a dicing tape, an inflexible tape suitable for thin wafer dicing or backgrinding, and a glass or other transparent solid.

13. The method as claimed in claim 1, wherein the step of providing a structure comprises providing the wafer substrate separated facedown from substantially inflexible transparent backgrinding tape by the adhesive layer, and wherein the step of laser machining is performed subsequent to backgrinding the wafer substrate.

14. The method as claimed in claim 1, wherein the singulated die and the attached singulated adhesive layer are removed from the carrier base and placed on another die to form a multistack die package.

15. A laser machining system for forming dies from a structure including a wafer substrate, a carrier base, and a curable adhesive layer in a non-cured state and positioned between and adhered to the wafer substrate and the carrier base, the adhesive layer adapted to separate from the carrier base when treated in accordance with a first curing process and adapted to adhere to die pads when placed on the die pads and treated in accordance with a second curing process, comprising:
a laser source arranged to provide a laser beam configured to cut through the wafer substrate and the adhesive layer and thereby form singulated dies with attached singulated adhesive layers;
a laser scanner cooperating with the laser source to impart movement of the laser beam relative to the wafer substrate;
a memory storing first and second laser machining profiles that specify values of machining parameters of the laser source and laser scanner for different machining processes;
a laser controller communicating with the laser source, the laser scanner, and the memory, the laser controller configured to control the machining parameters in accordance with the first and second laser machining profiles, the first laser machining profile being configured to enable the laser beam to cut through the wafer substrate, the second laser machining profile being configured to enable the laser beam to cut through the adhesive layer, and the second laser machining profile being different from the first laser machining profile and adapted to inhibit delamination of the adhesive layer from the carrier base with the adhesive layer in the non-cured state.

16. The laser machining system as claimed in claim 15, wherein the machining parameters include laser pulse power, laser wavelength, laser pulse repetition rate, laser pulse width, and laser scanning speed, and wherein the first laser machining profile corresponds to a first set of values of the machining parameters and the second laser machining profile corresponds to a second set of values of the machining parameters, a machining parameter value of the second set being different from a corresponding machining parameter value of the first set, the values of the first and second sets being selected such that a speed of machining the structure is maximised while providing a predetermined quality of singulated dies without substantial production of burrs.

17. The laser machining system as claimed in claim 16, wherein the machining parameters include a number of scans by the laser beam.

18. The method as claimed in claim 2, wherein each of the wafer substrate and the adhesive layer is characterized by a thickness and a machinability, the first set of values for the machining parameters being selected based on the thickness and the machinability of the wafer substrate, and the second set of values for the machining parameters being selected based on the thickness and the machinability of the adhesive layer.

19. The method as claimed in claim 2, wherein the laser machining includes using a third laser machining profile to cut into a portion of the carrier base, the third laser machining profile corresponding to a third set of values for the machining parameters.

20. The method as claimed in claim 19, wherein at least two of the first, second, and third laser machining profiles include the same value for at least one of the machining parameters.

21. The method as claimed in claim 1, wherein the laser machining comprises:
  cutting through the wafer substrate along a pattern to form multiple dice lanes; and
  cutting through the adhesive layer along the multiple dice lanes after all of the multiple dice lanes are formed.

* * * * *